(12) United States Patent
Verde et al.

(10) Patent No.: US 12,315,897 B2
(45) Date of Patent: May 27, 2025

(54) SYSTEMS AND METHODS FOR RAPID TESTING OF A WORKING ELECTRODE

(71) Applicant: TROJAN BATTERY COMPANY, LLC, Santa Fe Springs, CA (US)

(72) Inventors: Michael Verde, Santa Fe Springs, CA (US); Shawn Peng, Santa Fe Springs, CA (US)

(73) Assignee: TROJAN BATTERY COMPANY, LLC, Santa Fe Springs, CA (US)

( * ) Notice: Subject to any disclaimer, the term of this patent is extended or adjusted under 35 U.S.C. 154(b) by 0 days.

(21) Appl. No.: 17/806,988

(22) Filed: Jun. 15, 2022

(65) Prior Publication Data

US 2023/0411710 A1    Dec. 21, 2023

(51) Int. Cl.
*G01R 31/36* (2020.01)
*H01M 4/14* (2006.01)
*H01M 10/42* (2006.01)

(52) U.S. Cl.
CPC ........ *H01M 10/4285* (2013.01); *G01R 31/36* (2013.01); *H01M 4/14* (2013.01)

(58) Field of Classification Search
None
See application file for complete search history.

(56) References Cited

U.S. PATENT DOCUMENTS

| | | | | |
|---|---|---|---|---|
| 2,768,229 | A * | 10/1956 | Herbert | H01M 6/12 429/174 |
| 2005/0287434 | A1* | 12/2005 | Kim | H01M 50/184 429/161 |
| 2015/0194657 | A1* | 7/2015 | Kim | H01M 6/46 429/161 |
| 2016/0372946 | A1* | 12/2016 | Menzer | H01M 10/4257 |
| 2017/0059520 | A1* | 3/2017 | Yang | G01N 27/301 |

FOREIGN PATENT DOCUMENTS

| | | |
|---|---|---|
| CN | 214844956 U | 11/2021 |
| DE | 3014435 C2 | 3/1984 |
| FR | 3077388 A1 | 8/2019 |
| WO | 2014008942 A1 | 1/2014 |
| WO | 2020225509 A1 | 11/2020 |

OTHER PUBLICATIONS

Abe Takeshi; Electrolytic Solution Evaluation Method; Toyota Motor Corp; JP 2012032343 A; Date Published Feb. 16, 2012; IPC: G01N27/416 (Year: 2012).*

Extended European Search Report and Written Opinion issued for European Patent Application No. 23179014.8 dated Nov. 7, 2023.

* cited by examiner

*Primary Examiner* — Nasima Monsur

(74) *Attorney, Agent, or Firm* — Duane Morris LLP

(57) ABSTRACT

A system includes a body, a rod extending beyond a length of the body, a first cap at a first end of the body, and a second cap at a second end of the body. The first cap and the second cap are removably connected to the body. The system also includes a cup including an active material. The cup is located in the second cap. The system further includes a gasket between the cup and the body. The second cap exerting a force on the cup to press the cup against the gasket.

19 Claims, 8 Drawing Sheets

SYSTEMS AND METHODS FOR RAPID TESTING OF A WORKING ELECTRODE

TECHNICAL FIELD

The disclosure relates generally to systems and methods for rapid testing of a working electrode and more particularly to a working electrode apparatus for rapidly testing lead-acid battery materials.

BACKGROUND

Battery testing is an expensive and time-consuming process to measure a plurality of different factors to determine which materials and/or substances improve the battery design.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

A system includes a body, a rod extending beyond a length of the body, a first cap at a first end of the body, and a second cap at a second end of the body. The first cap and the second cap are removably connected to the body. The system also includes a cup including an active material. The cup is located in the second cap. The system further includes a gasket between the cup and the body. The second cap exerting a force on the cup to press the cup against the gasket.

In further aspects, the first end of the body and the second end of the body include external threads, and the first cap and the second cap include internal threads. In further aspects, the first cap and the second cap attach to the body via the external threads and the internal threads.

In further aspects, the cup includes a cavity, and the cavity is configured to hold the active material.

In further aspects, the cup is flat and the active material is adhered to a surface of the cup.

In further aspects, the system includes a spring. The spring exerts a force on a flange of the rod and the first cap to maintain contact between the rod and the cup when the first cap is coupled to the body.

In further aspects, the gasket creates a seal between the cup and the body.

In further aspects, the first cap, the second cap, and the body are an insulating plastic.

In further aspects, the rod is a highly conductive metal.

In further aspects, the cup is an active material current collector.

A rapid testing system includes a system including a body, a rod extending beyond a length of the body, a first cap at a first end of the body, and a second cap at a second end of the body. The first cap and the second cap are removably connected to the body. The system also includes a cup including an active material. The cup is located in the second cap. The system further includes a gasket between the cup and the body. The second cap exerting a force on the cup to press the cup against the gasket. The rapid testing system further includes a reference electrode, a counter electrode, and a container including an electrolyte liquid. The system, the reference electrode, and the counter electrode are at least partially submerged in the electrolyte liquid.

In further aspects, the rapid testing system includes a signal generator electrically coupled to the system, the reference electrode, and the counter electrode via wires.

In further aspects, the rapid testing system includes an ammeter arranged between the signal generator and the counter electrode, the ammeter being configured to measure and monitor a current.

In further aspects, the rapid testing system includes a voltmeter arranged between the signal generator and the reference electrode, the voltmeter being configured to measure and monitor a voltage.

A rapid testing system includes a working electrode including a body, a rod extending beyond a length of the body, a cup including an active material. The cup being removably in contact with the rod. The rapid testing system also includes a gasket between the cup and the body, a reference electrode, and a counter electrode. The working electrode, the reference electrode, and the counter electrode are partially submerged in an electrolyte liquid. The rapid testing system also includes a signal generator electrically coupled to the working electrode, the reference electrode, and the reference electrode to generate a signal and measure characteristics of the active material.

In further aspects, the rapid testing system includes a computing device communicatively coupled to the signal generator. The computing device is configured to receive measured characteristics of the active material and display on a user interface of the computing device.

In further aspects, the rapid testing system includes a first cap at a first end of the body and a second cap at a second end of the body. The first cap and the second cap are removably connected to the body. The second cap includes a hole and exerts a force on the cup to press the cup against the gasket, creating a seal between the body and the cup.

In further aspects, the first end of the body and the second end of the body include external threads. In further aspects, the first cap and the second cap include internal threads. In further aspects, the first cap and the second cap attach to the body via the external threads and the internal threads.

In further aspects, the rapid testing system a spring, wherein the spring exerts a force on a flange of the rod and the first cap to maintain contact between the rod and the cup when the first cap is coupled to the body.

In further aspects, the cup includes a cavity, and the cavity is configured to hold the active material.

In further aspects, the cup is flat and the active material is adhered to a surface of the cup.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The features and advantages of the present disclosures will be more fully disclosed in, or rendered obvious by, the following detailed descriptions of example embodiments. The detailed descriptions of the example embodiments are to be considered together with the accompanying drawings wherein like numbers refer to like parts and further wherein.

In the drawings, reference numbers may be reused to identify similar and/or identical elements.

DETAILED DESCRIPTION

Figure 1:
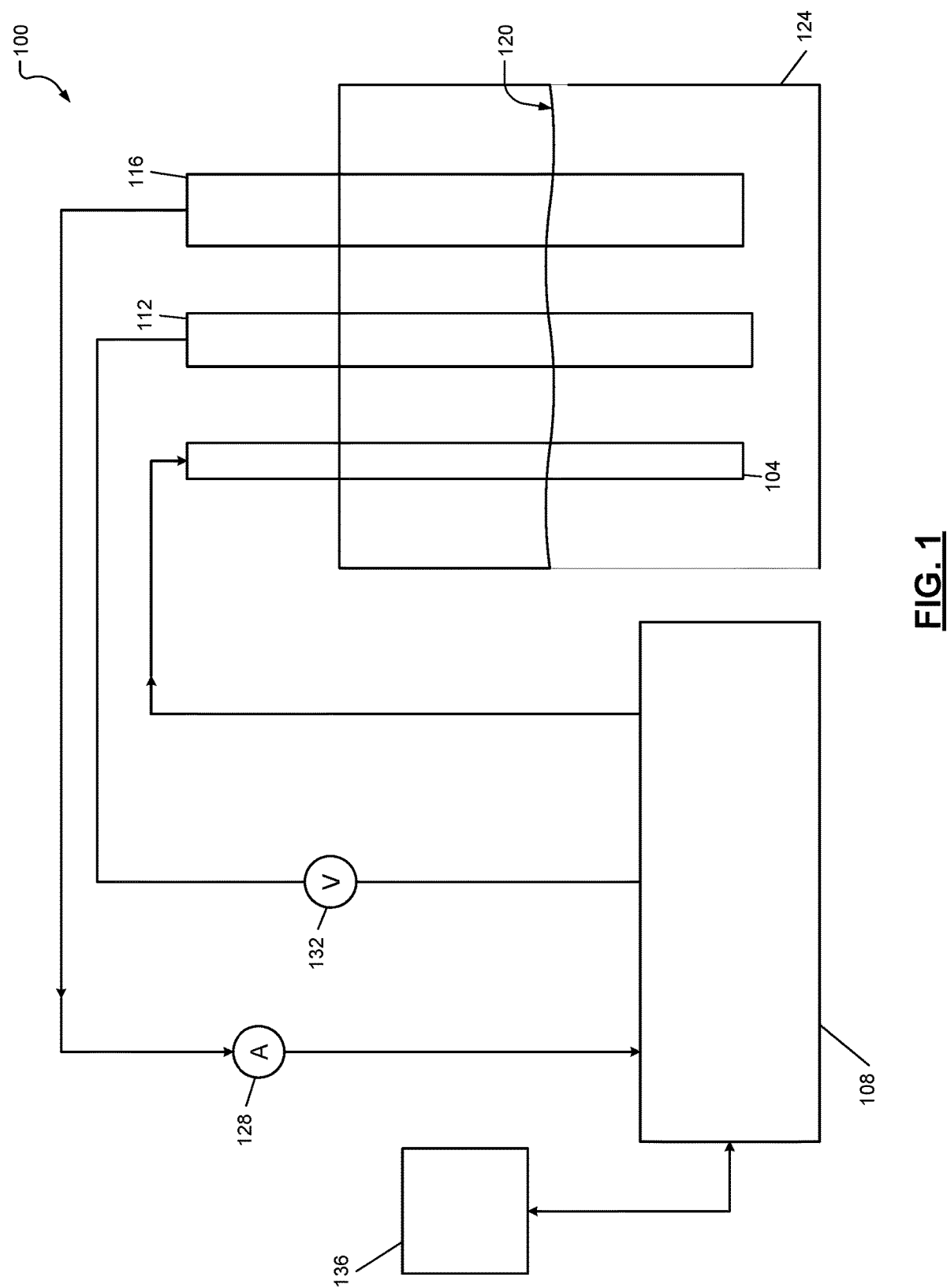
FIG. 1 is an example diagram illustrating a rapid testing system setup for a working electrode in accordance with some embodiments.

The description of the preferred embodiments is intended to be read in connection with the accompanying drawings, which are to be considered part of the entire written description of these disclosures. While the present disclosure is susceptible to various modifications and alternative forms, specific embodiments are shown by way of example in the drawings and will be described in detail herein. The objectives and advantages of the claimed subject matter will become more apparent from the following detailed description of these exemplary embodiments in connection with the accompanying drawings.

It should be understood, however, that the present disclosure is not intended to be limited to the particular forms disclosed. Rather, the present disclosure covers all modifications, equivalents, and alternatives that fall within the spirit and scope of these exemplary embodiments. The terms "couple," "coupled," "operatively coupled," "connected," "operatively connected," and the like should be broadly understood to refer to connecting devices or components together either mechanically, electrically, wired, wirelessly, or otherwise, such that the connection allows the pertinent devices or components to operate (e.g., communicate) with each other as intended by virtue of that relationship.

A rapid testing system setup provides a method of quickly testing a plurality of active materials or pastes using a working electrode configuration that easily replaces an active material with another active material. The rapid testing system is an apparatus including a working electrode, which can be used in a three-electrode system to test the properties of each active material of the plurality of active materials to identify the active material that is best used in a lead-acid battery. For example, the rapid testing system may be capable of testing both positive active-materials and negative active-materials. The rapid testing system includes a cup that is attached to a body of the working electrode by a threaded, bottom cap. To replace and test multiple active materials, a plurality of cups can hold one of the active materials of the plurality of active materials. Each cup can be replaced in the rapid testing system by removing the bottom cap, removing a present cup, and adding in another cup with a different active material. In this way, the same working electrode can be used to test a different active material that is easily added to the working electrode and used within the same three-electrode system.

The working electrode is specially designed for the rapid and fundamental analysis of a variety of active materials and more particularly to the electrochemical performance of the multiple different active materials. The presently described design is particularly directed towards, but not limited to, the optimization of lead-acid battery materials and formulae. The development and testing of battery materials is a costly endeavor, specifically regarding the time and resources (equipment, material, personnel, etc.) required. A robust design of experiment aimed to optimize three to four different conditions may require the construction of tens or hundreds of large batteries, and each battery is potentially comprised of tens of kilograms of lead (in the case of lead-acid batteries). Assembling these batteries may require a number of personnel, high-current/voltage testing platforms, and monitoring over the course of months.

The presently disclosed invention focuses the core battery system necessary to optimize active materials, or specifically regarding lead-acid batteries, paste, into a simplified working electrode. The working electrode mimics the performance of paste within a single electrode of a full-cell battery. Moreover, the working electrode of the rapid testing system requires less than one gram of paste or active material, enabling fewer personnel to more easily synthesize, assemble, and test a large array of active materials and conditions. Because of the small and controlled size, the working electrode also allows for the use of smaller and less expensive equipment, as well as much faster testing. In addition, by focusing the analysis on a single electrode, the working electrode can provide a more detailed and fundamental understanding of the reactions occurring.

The rapid testing system includes a working electrode design meant for rapid testing and screening of electrochemically active materials and/or additives included in a battery electrode. The rapid testing system includes an electrically insulating body and two insulating endcaps: a top cap and a bottom cap. The bottom cap includes a cup that holds active material within a cavity and a gasket. The bottom cup is composed of current collector material suitable for the active material attached, for example, lead, aluminum, copper, etc. The bottom cup dimensions can vary such that the volume is zero, meaning the active material is affixed to a flat current collector substrate or include a cavity for holding the active material. In various implementations, the cup can have larger dimensions for certain active materials, such as pastes including positive active material (PAM) and negative active material (NAM) present in lead-acid batteries.

The gasket can be placed on top of the bottom cup so that when the bottom cap is coupled to or threaded onto the body, a seal is formed between the bottom cup, the body, and the bottom cap. A hole is inside the bottom through which a highly conductive rod can be placed or inserted. The rod is in contact with a back of the cup opposite to where active material is adhered within a chamber that is sealed by the gasket. The top cap couples to, via threads on the top cap and the body, the other side of the body. When the top cap is coupled to the body, the rod is pushed towards the bottom cap. In other words, the top cap exerts a downward force on a spring located between the top cap and the flange of the rod to maintain strong and controlled contact between the rod and the cup.

The bottom portion of the working electrode is submerged in electrolyte. The top portion, with rod exposed, is connected to the testing instrument via, for example, an alligator clip. The working electrode is treated as a working electrode in a variety of electrode testing configurations, including, for example, a reference electrode and a counter electrode. While testing with small, cylindrical working electrodes is common in the field of electrochemistry, those electrodes are typically composed of a single, uniform body. In the presently described invention, the bottom cap is removable to replace the cup, and with it the active material, to easily and quickly test a plurality of active materials. That is, the prior art configurations include components that are fixed in place and cannot be separated from one another.

One of the key unique features of the rapid testing system is that the current collector of the cup is tailored to the active material of interest and can be easily swapped in and out of the working electrode. That is, the cup can be subject to standard active material processing conditions. The design and functionality of the cup enables the application, assembly, and testing of active material to much more closely mimic behavior in an actual battery environment. The ability to repeatedly remove and insert the cup from the rest of the working electrode at any point during testing also enables complimentary analysis to be easily performed, for example, using x-ray, electron, optical techniques etc. Overall, the rapid testing system provides faster testing, greater insight into material mechanisms, more accurate modeling of full-scale lead-acid battery systems, and larger testing arrays that can be more easily performed on a variety of cups including different active materials.

Referring now to FIG. 1, an example diagram illustrating a rapid testing system 100 setup for a working electrode 104 is shown. A signal generator 108 can be electrically coupled to the rapid testing system 100. In various implementations, the signal generator 108 can be a potentiostat, a voltage generator, galvanostat, impedance analyzer, etc. The rapid testing system 100 can include the working electrode 104, a reference electrode 112, and a counter electrode 116 partially submerged in an electrolyte substance 120, all of which are included in a container 124. Electrical wire connects the signal generator 108 to the working electrode 104, the reference electrode 112, and the counter electrode 116. An ammeter 128 can be included between the signal generator 108 and the counter electrode 116 to measure a current, and a voltmeter 132 can be between the signal generator 108 and the reference electrode 112 to measure a voltage. In various implementations, the ammeter 128 and the voltmeter 132 can be connected to a computing device 136 including a memory and at least one processor for analyzing and storing measurement data for each of the different cups and active material being tested and measured. The computing device 136 can also include a display configured to display measurements of the active material. As described above, the working electrode 104 includes a replaceable cup with active material for testing and measurement within the rapid testing system.

Figure 2:
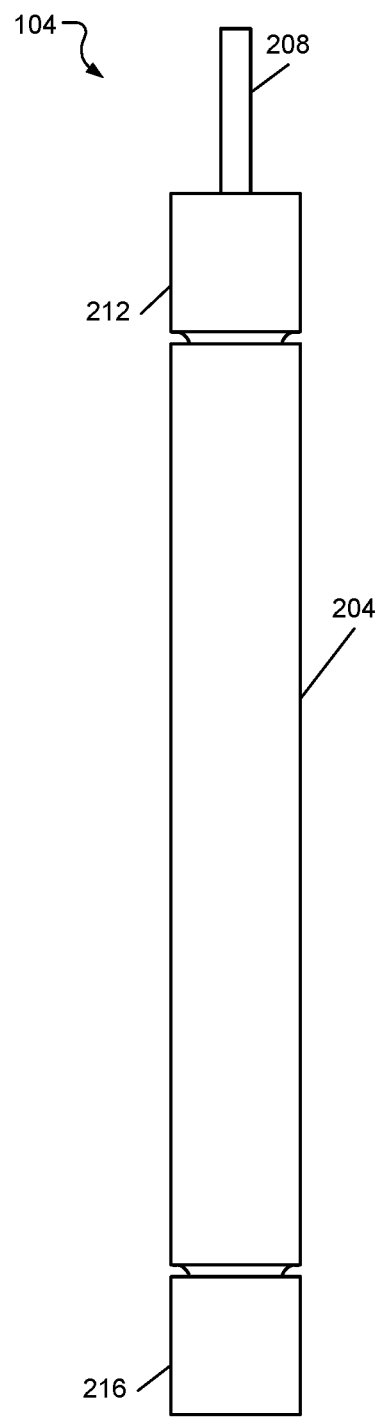
FIG. 2 is an example diagram illustrating a working electrode of the rapid testing system setup of FIG. 1 in accordance with some embodiments.

Referring to FIG. 2, an example diagram illustrating the working electrode 104 of the rapid testing system 100 setup of FIG. 1 is shown. As previously described, the working electrode 104 includes a body 204, a rod 208, a top cap 212, and a bottom cap 216. The body 204, the top cap 212, and the bottom cap 216 can be made of an insulating material and the rod 208 can be made of a highly conductive material.

Figure 3:
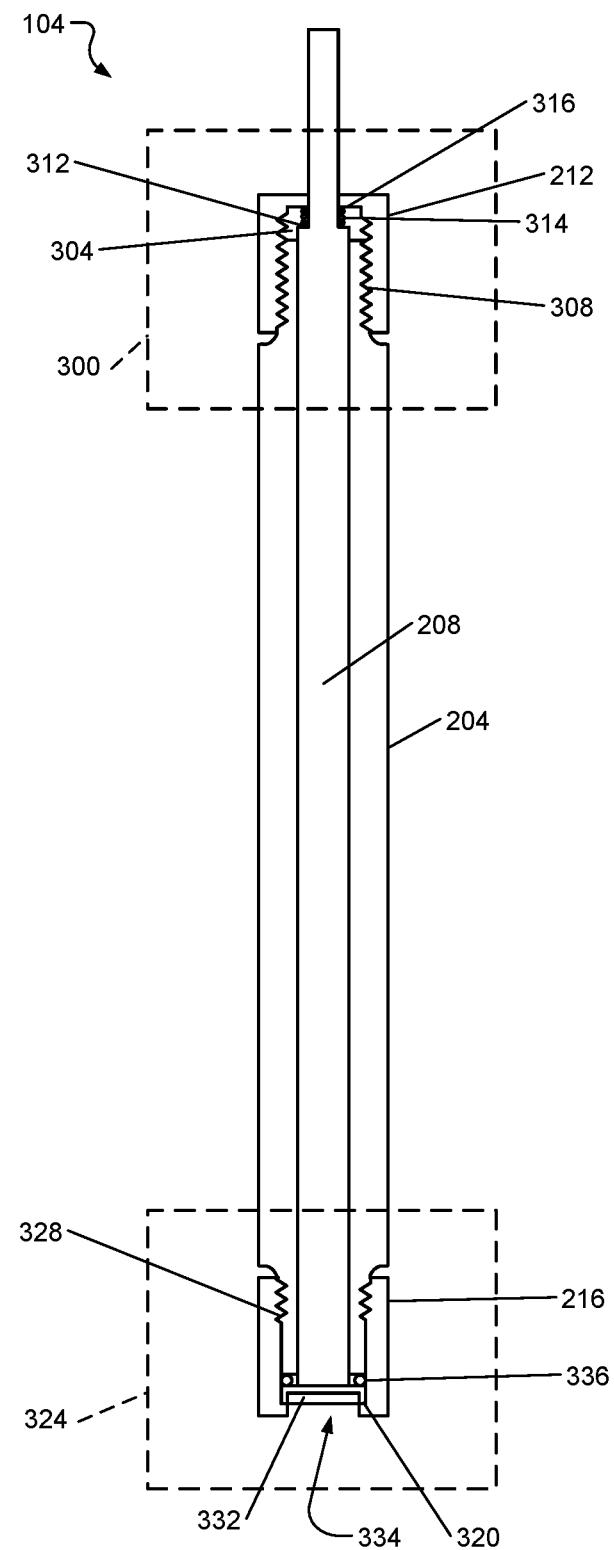
FIG. 3 is a cross section of the example diagram illustrating the working electrode of the rapid testing system setup of FIG. 1 in accordance with some embodiments.

Referring to FIG. 3, a cross section of the example diagram illustrating the working electrode 104 of the rapid testing system 100 setup of FIG. 1 is shown. A top cap section 300 depicts a cavity 304 of the top cap 212 and illustrates external threads 308 of the body 204 coupled to the top cap 212. In various implementations, a flange 312 of the rod 208 is being held or pressed down by a spring 314. The spring 314 may be included between the flange 312 of the rod 208 and a top cavity portion 316 of the top cap 212. The spring 314 exerts a downward force against the flange 312 and an upward force against the top cap 212 to ensure contact between the rod 208 and a cup 320 shown in a bottom cap section 324. In further implementations, the flange 312 may be in contact with the top cavity portion 316 of the top cap 212. In such an implementation, the top cavity portion 316 exerts a downward force on the rod 208 to ensure contact between the rod 208 and the cup 320 shown in the bottom cap section 324. The other end of the body 204 is shown in the bottom cap section 324 and also includes external threads 328 (the bottom cap 216 and top cap 212 including internal threads) to attach to the bottom cap 216.

The cup 320 includes a cup cavity 332 that receives and holds active material or paste placed in the cup cavity 332 to test and measure. As discussed above, the cup 320 can be flat or include the cup cavity 332 based on the active material being tested. Further, the cup 320 can be comprised of or made from a current collector material based on the active material being tested and measured. A gasket 336 is placed between the body 204 and the cup 320 creating a seal to protect the rod 208 from the electrolyte in which the bottom cap section 324 is placed for measurements. The gasket 336 can be a ring made from a silicone or other material that creates a liquid-proof seal between the body 204 and the cup 320. As also shown, the rod 208 is in continuous contact with the cup 320 as a result of the top cap 212 and the bottom cap 216 being screwed on to the body 204. The rod 208 exits a top of the top cap 212 to connect to an electrical wire or other electrical connection to receive signals and measure properties of the active material adhered to the cup 320. As also shown, the bottom cap 216 includes an opening 334 so that the electrolyte can reach the active material or paste placed in the cup cavity 332 for testing.

Figure 5:
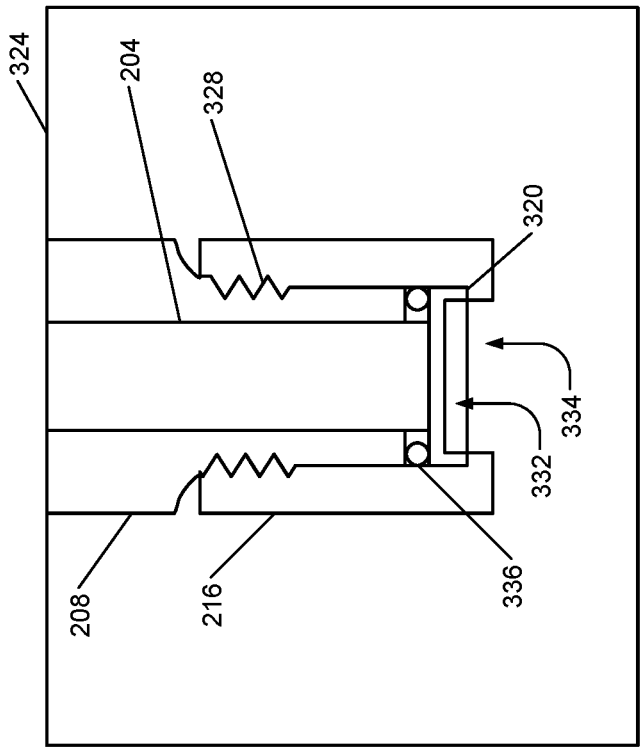
FIG. 5 is an example diagram illustrating a bottom cap of the working electrode of FIGS. 2 and 3 in accordance with some embodiments.
Figure 4:
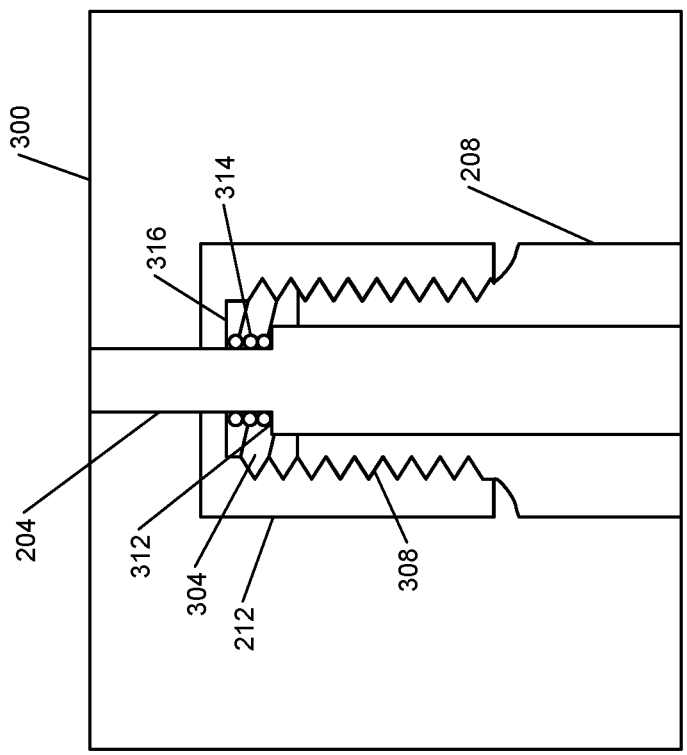
FIG. 4 is an example diagram illustrating a top cap of the working electrode of FIGS. 2 and 3 in accordance with some embodiments.

Referring to FIGS. 4 and 5, an example diagram illustrating the top cap 212 of the working electrode 104 and an example diagram illustrating the bottom cap 216 of the working electrode 104 are shown, respectively.

Figure 6:
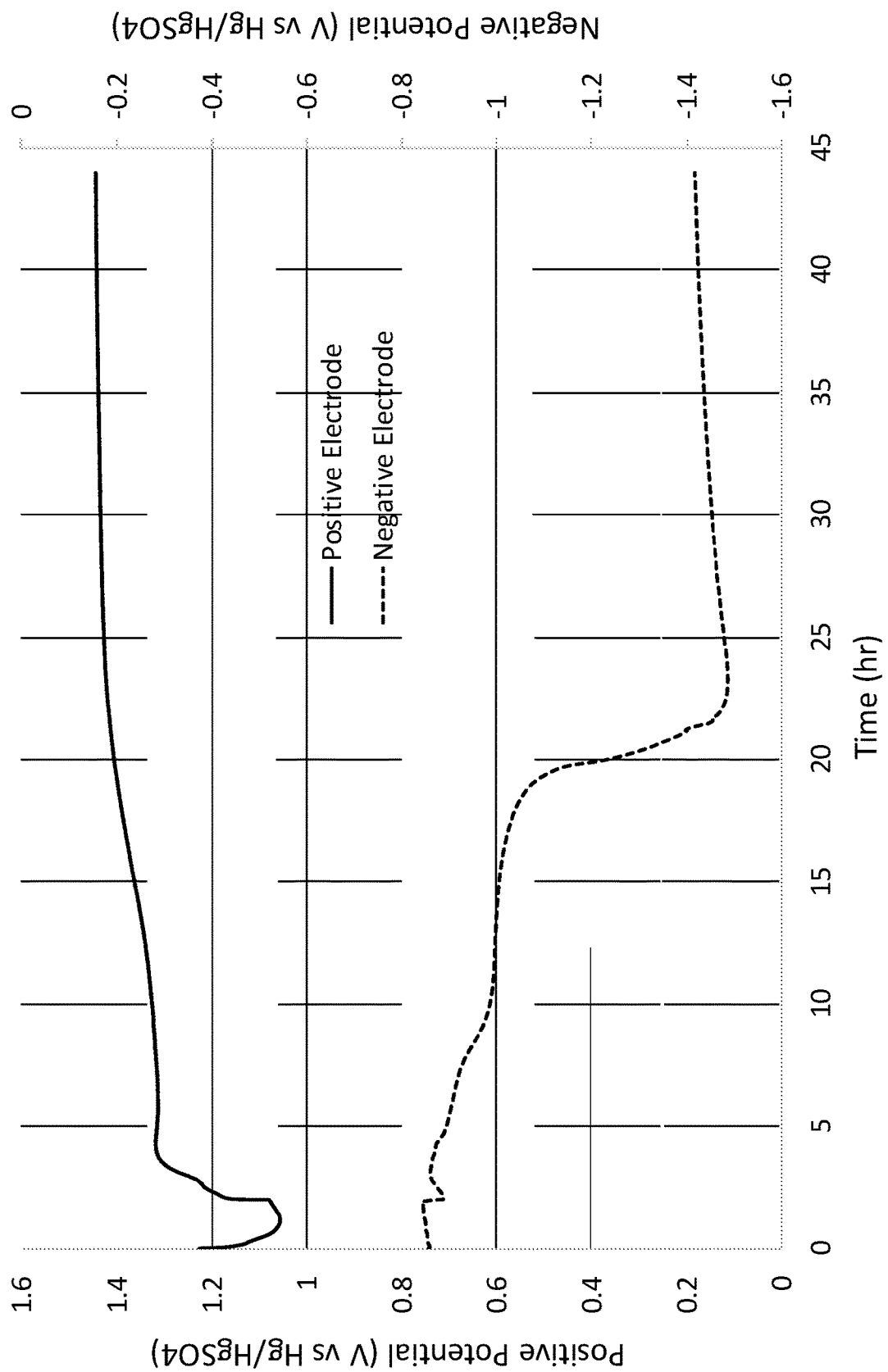
FIG. 6 is a graphical depiction of half-cell formation voltage of lead-acid positive and negative working electrodes in accordance with some embodiments.

Generally, FIGS. 6-10 depict how the working electrode design presented above functions as an effective electrode to use in an array of electrochemical analyses. Referring to FIG. 6, a graphical depiction of half-cell formation voltage of lead-acid positive and negative working electrodes is shown. As shown in the graph, the measurements of the positive potential and negative potential for the corresponding electrode over time is depicted.

Figure 7:
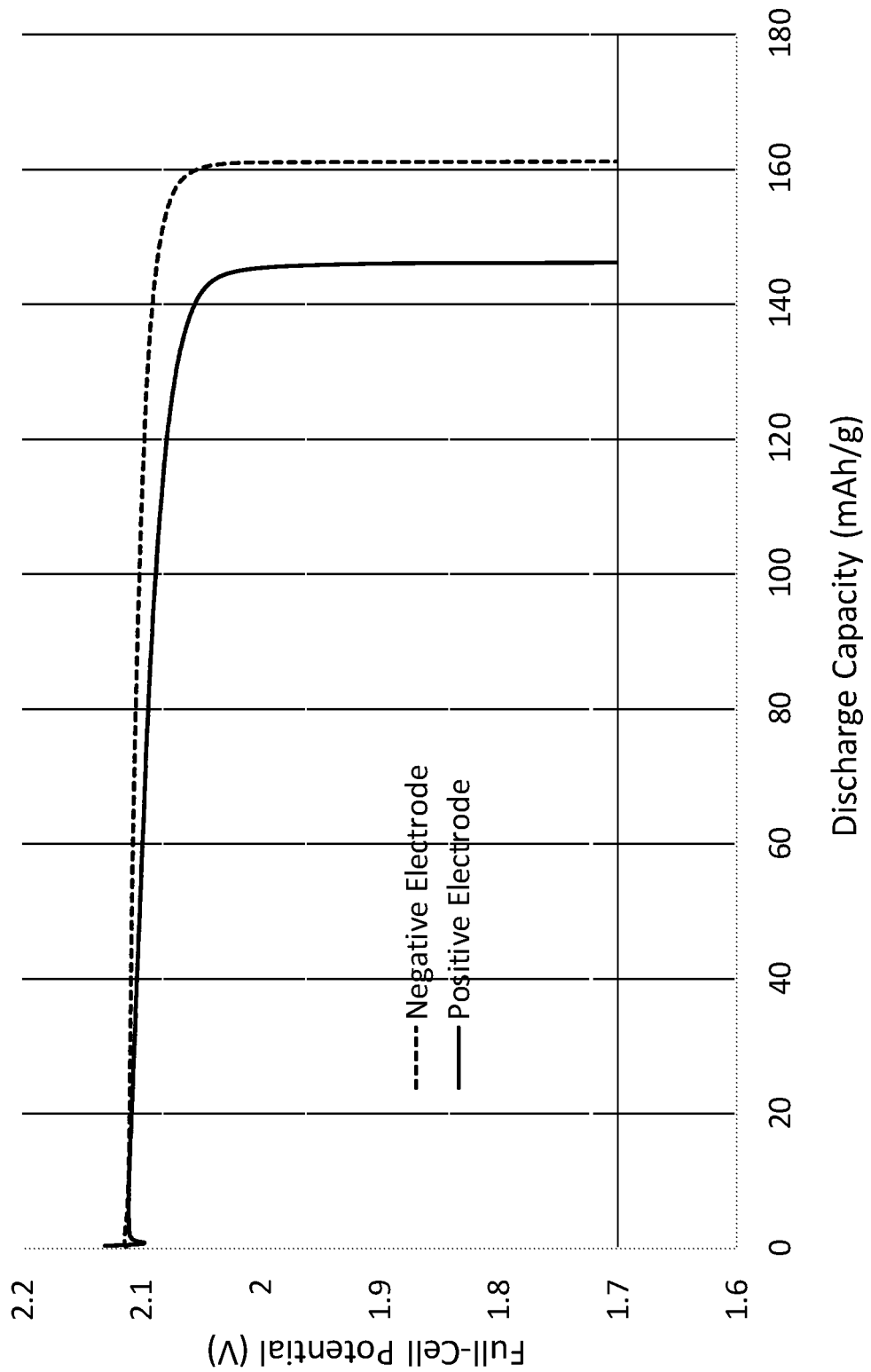
FIG. 7 is a graphical depiction of full-cell discharge capacity of lead-acid positive and negative working electrodes in accordance with some embodiments.

Referring to FIG. 7, a graphical depiction of full-cell discharge capacity of lead-acid positive and negative working electrodes is shown. As shown in the graph, the discharge capacity is depicted from the positive and negative electrodes.

Figure 8:
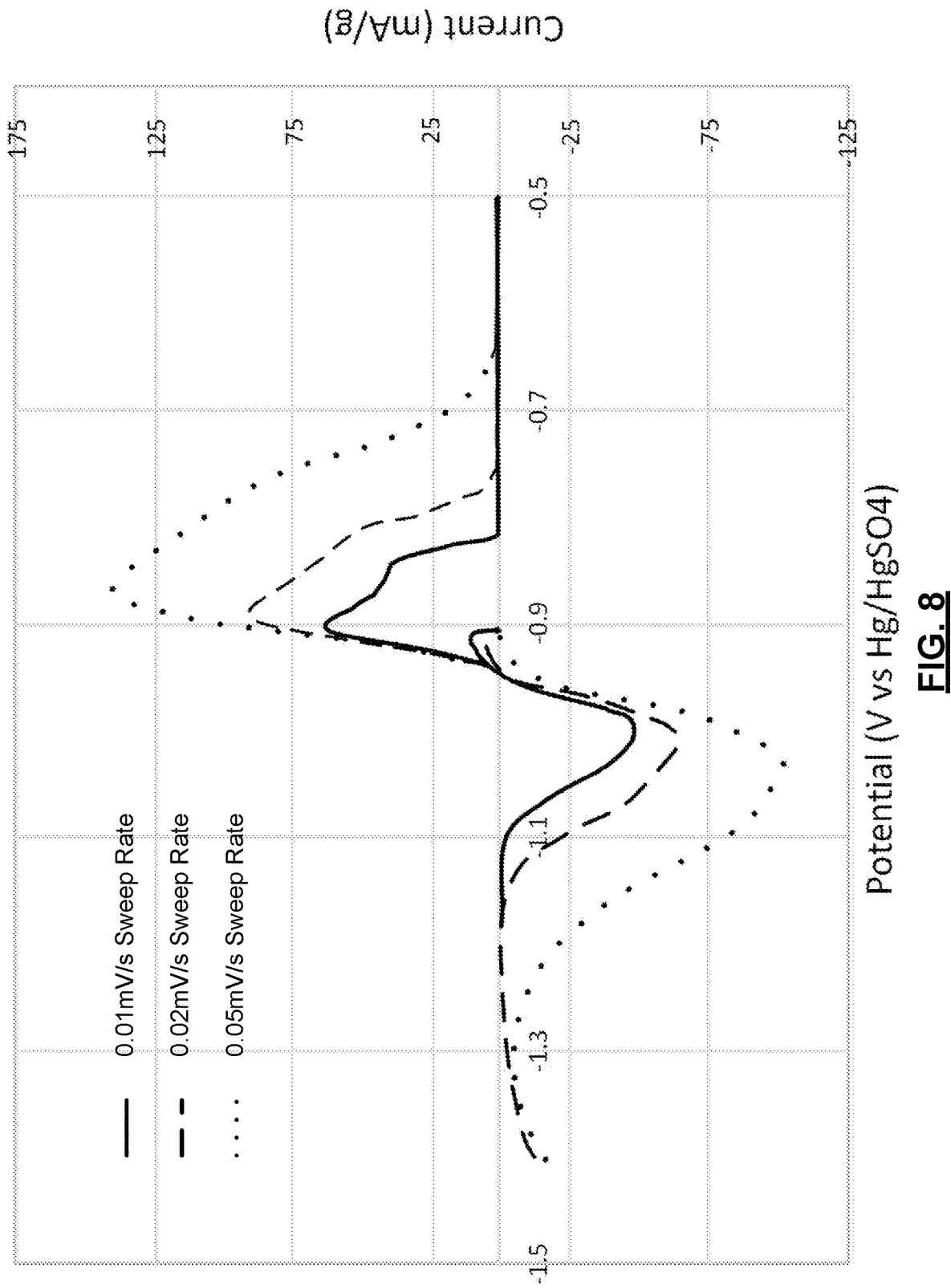
FIG. 8 is a graphical depiction of half-cell cyclic voltammetry of a negative electrode in accordance with some embodiments.

Referring to FIG. 8, a graphical depiction of half-cell cyclic voltammetry of a negative electrode is shown. As shown, in a lead-acid system, a negative electrode is swept at rates of 0.01 mV/s, 0.02 mV/s, and 0.05 mVs while measuring current as a function of voltage against a Hg/HgSO4 reference electrode.

Figure 9:
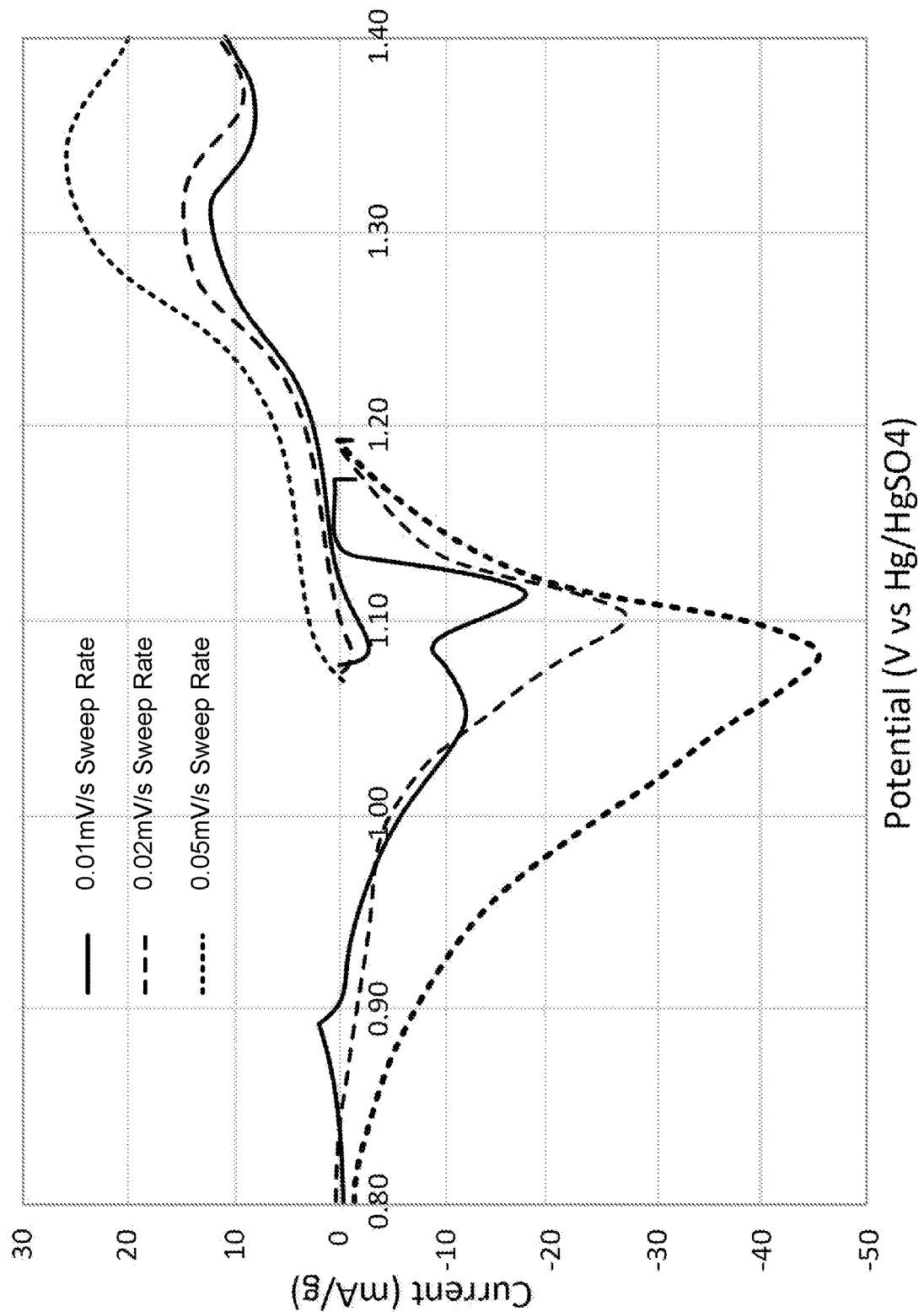
FIG. 9 is a graphical depiction of half-cell cyclic voltammetry of a positive electrode in accordance with some embodiments.

Referring to FIG. 9, a graphical depiction of half-cell cyclic voltammetry of a positive electrode is shown. As shown, in a lead-acid system, a positive electrode is swept at rates of 0.01 mV/s, 0.02 mV/s, and 0.05 mVs while measuring current as a function of voltage against a Hg/HgSO4 reference electrode.

Figure 10:
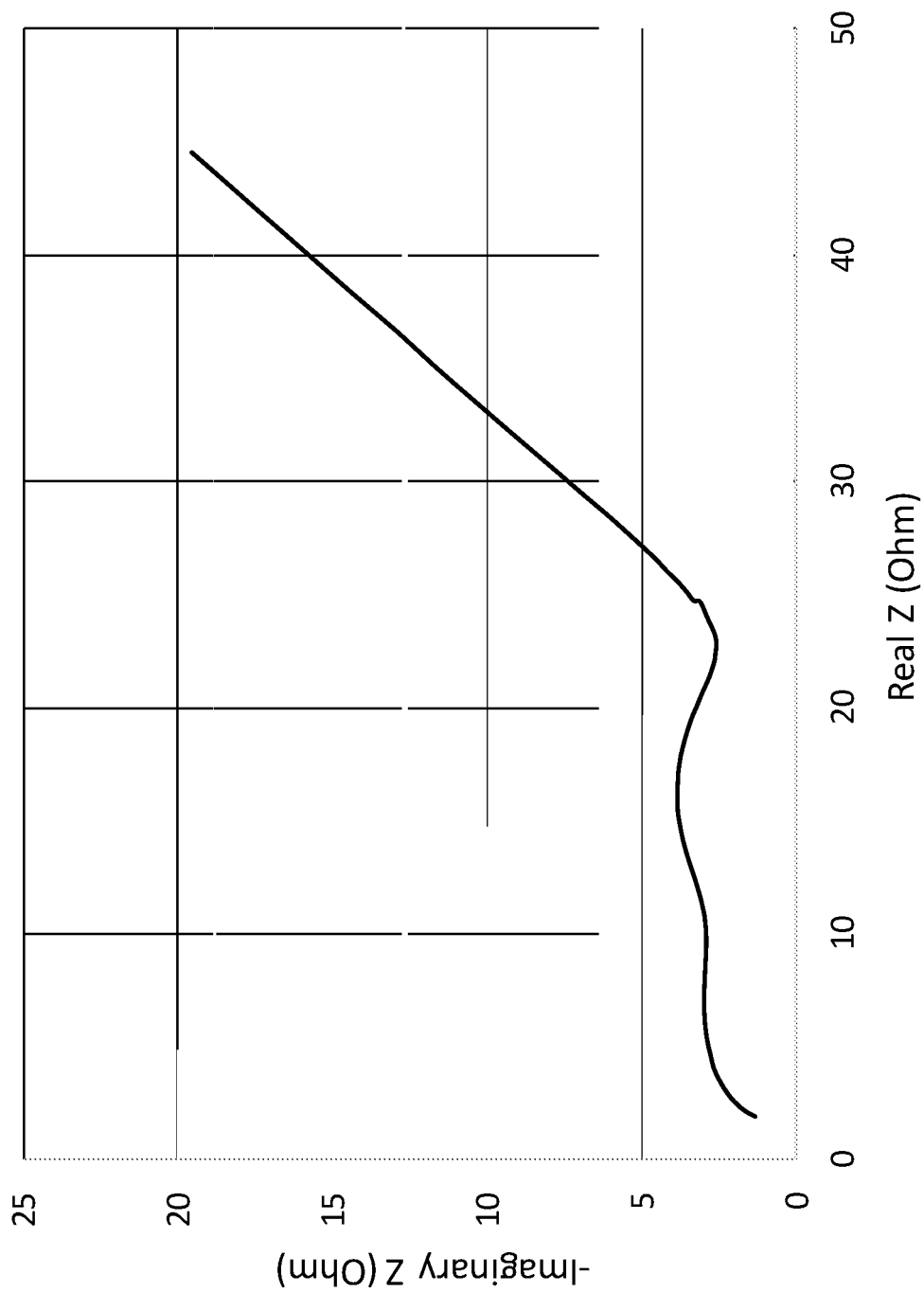
FIG. 10 is a graphical depiction of electrochemical impedance (EIS) spectra of a working electrode in accordance with some embodiments.

Referring to FIG. 10, a graphical depiction of electrochemical impedance (EIS) spectra of a working electrode is shown.

In addition, the methods and system described herein can be at least partially embodied in the form of computer-implemented processes and apparatus for practicing those processes. The disclosed methods may also be at least partially embodied in the form of tangible, non-transitory machine-readable storage media encoded with computer program code. For example, the steps of the methods can be embodied in hardware, in executable instructions executed by a processor (e.g., software), or a combination of the two. The media may include, for example, RAMs, ROMs, CD-ROMs, DVD-ROMs, BD-ROMs, hard disk drives, flash memories, or any other non-transitory machine-readable storage medium. When the computer program code is loaded into and executed by a computer, the computer becomes an apparatus for practicing the method. The methods may also be at least partially embodied in the form of a computer into which computer program code is loaded or executed, such that, the computer becomes a special purpose computer for practicing the methods. When implemented on a general-purpose processor, the computer program code segments configure the processor to create specific logic circuits. The methods may alternatively be at least partially embodied in application specific integrated circuits for performing the methods.

The foregoing is provided for purposes of illustrating, explaining, and describing embodiments of these disclosures. Modifications and adaptations to these embodiments will be apparent to those skilled in the art and may be made without departing from the scope or spirit of these disclosures.

What is claimed is:

1. A working electrode system comprising:
a body;
a single conductive rod including a flange and extending through two ends of the body;
a first cap at a first end of the body;
a second cap at a second end of the body, the first cap and the second cap being reusably connected to the body;
a cup configured to hold an active material, the cup being located in the second cap;
a gasket between the second cap and the body, the second cap exerting a force on the cup to press the cup against the gasket; and
a spring exerting a force in a direction parallel to a longitudinal axis of the body between the first cap, the flange of the rod, and the cup when the first cap and the second cap are connected to the body.

2. The system of claim 1, wherein:
the first end of the body and the second end of the body include external threads,
the first cap and the second cap include internal threads, and
the first cap and the second cap attach to the body via the external threads and the internal threads.

3. The system of claim 1, wherein the cup is flat and the active material is adhered to a surface of the cup.

4. The system of claim 1, wherein the gasket creates a seal between the cup and the body.

5. The system of claim 1, wherein the first cap, the second cap, and the body are an insulating plastic.

6. The system of claim 1, wherein the rod is a highly conductive metal.

7. The system of claim 1, wherein the cup is an active material current collector.

8. A rapid testing system comprising:
the system of claim 1;
a reference electrode;
a counter electrode;
a container including an electrolyte liquid, the system of claim 1, the reference electrode, and the counter electrode being at least partially submerged in the electrolyte liquid.

9. The rapid testing system of claim 8, further comprising:
a signal generator electrically coupled to the system of claim 1, the reference electrode, and the counter electrode via wires.

10. The rapid testing system of claim 9, further comprising:
an ammeter arranged between the signal generator and the counter electrode, the ammeter being configured to measure and monitor a current.

11. The rapid testing system of claim 9, further comprising:
a voltmeter arranged between the signal generator and the reference electrode, the voltmeter being configured to measure and monitor a voltage.

12. The system of claim 1, wherein the second cap includes an opening so that electrolyte can reach the active material placed in the cup for testing.

13. A rapid testing system comprising:
a working electrode including:
a body;
a single conductive rod including a flange and extending through two ends of the body;
a cup configured to hold an active material, the cup being reusably in contact with the rod; and
a spring exerting a force in a direction parallel to a longitudinal axis of the body between a stop, the flange of the rod, and the cup when the cup is in contact with the rod;
a reference electrode;
a counter electrode, the working electrode, the reference electrode, and the counter electrode being partially submerged in an electrolyte liquid; and
a signal generator electrically coupled to the working electrode, the reference electrode, and the reference electrode to generate a signal and measure characteristics of the active material.

14. The rapid testing system of claim 13, further comprising a computing device communicatively coupled to the signal generator, the computing device being configured to receive measured characteristics of the active material and display on a user interface of the computing device.

15. The rapid testing system of claim 13, further comprising:
a first cap at a first end of the body;
a second cap at a second end of the body, the first cap and the second cap being removably connected to the body; and
the second cap including a hole and exerting a force on the cup to press the cup against a gasket, creating a seal between the body and the cup.

16. The rapid testing system of claim 15, wherein:
the first end of the body and the second end of the body include external threads,
the first cap and the second cap include internal threads, and
the first cap and the second cap attach to the body via the external threads and the internal threads.

17. The rapid testing system of claim 13, wherein the cup includes a cavity, and the cavity being configured to hold the active material.

18. The rapid testing system of claim 13, wherein the cup is flat and the active material is adhered to a surface of the cup.

19. The rapid testing system of claim 13, further comprising a second cap to hold the cup to the body, wherein the second cap includes an opening so that electrolyte can reach the active material placed in the cup for testing.

* * * * *